United States Patent [19]

Denda et al.

[11] 4,381,595

[45] May 3, 1983

[54] PROCESS FOR PREPARING MULTILAYER INTERCONNECTION

[75] Inventors: Masahiko Denda; Shinichi Sato, both of Itami; Wataru Wakamiya, Amagasaki; Hiroshi Harada, Kawanishi; Natsuro Tsubouchi; Hirokazu Miyoshi, both of Itami, all of Japan

[73] Assignee: Mitsubishi Denki Kabushiki Kaisha, Tokyo, Japan

[21] Appl. No.: 184,171

[22] Filed: Sep. 4, 1980

[30] Foreign Application Priority Data

Oct. 9, 1979 [JP] Japan .............................. 54-130378
Oct. 25, 1979 [JP] Japan .............................. 54-139136

[51] Int. Cl.³ .......................................... H01L 21/90
[52] U.S. Cl. ........................................ 29/589; 29/571
[58] Field of Search ................... 29/571, 589; 357/71

[56] References Cited

U.S. PATENT DOCUMENTS 3,771,218 11/1973 Langdon ............................... 29/589
3,803,705 4/1974 Goodwin ............................... 29/571
4,115,795 9/1978 Masuoka et al. ..................... 357/71
4,121,240 10/1978 Katto ..................................... 357/71
4,121,241 10/1978 Drake et al. ......................... 357/71
4,206,472 6/1980 Chu et al. ............................. 357/71

FOREIGN PATENT DOCUMENTS 2045633 4/1971 Fed. Rep. of Germany ........ 29/589

OTHER PUBLICATIONS

Ryden et al., A Metallization Providing Two Levels of Interconnect for Beam Leaded Silicon Integrated Circuits, Bell Telephone Labs., pp. 597–600.

Primary Examiner—Donald L. Walton
Attorney, Agent, or Firm—Oblon, Fisher, Spivak, McClelland & Maier

[57] ABSTRACT

A multilayer interconnection is prepared by forming a stable insulating film on a nitride film which is formed on a first interconnection metal layer, and then, a second interconnection metal layer is formed on the insulating film. The insulating film can be made of aluminum oxide, an oxynitride or the other metal oxide. A silicon rich layer can be used for this purpose.

2 Claims, 13 Drawing Figures

PROCESS FOR PREPARING MULTILAYER INTERCONNECTION

BACKGROUND OF THE INVENTION

1. Field of the Invention

The present invention relates to a process for preparing a multilayer interconnection in a semiconductor device.

2. Description of the Prior Art

It has been limited to form a layer insulating film which can be formed at a relatively low temperature when a material having a relatively low softening temperature such as aluminum or aluminum alloy is used for inner wirings in the preparation of such multilayer interconnection. In usual, a silicon oxide film formed by a chemical vapor deposition process or a sputtering process has been used as the layer insulating film. Recently a nitride film formed by a plasma enhanced chemical vapor deposition process has begun to be used because of excellent step-coverage on a step portion, low density of pin-holes and capability of processing through-holes by a dry-etching. When the multilayer interconnection is commercially formed, the mutual diffusion between the interconnection layer made of aluminum or aluminum alloy and the nitride film is resulted to disadvantageously cause short-circuit between the interconnections for the different layers.

SUMMARY OF THE INVENTION

It is an object of the present invention to overcome the disadvantages in the conventional device and to prevent the mutual diffusion between the interconnection layer made of aluminum or aluminum alloy and the nitride film by oxidizing the surface layer of the nitride film in the preparation of the nitride film by the plasma chemical vapor deposition process.

Another object of the present invention is to provide a preparation of a multilayer metal interconnection by forming a stable insulating film between a layer insulating film and a second layer interconnection metal layer to prevent a layer short-circuit.

The foregoing and other objects of the present invention have been attained by providing a process for preparing a multilayer interconnection which is obtained by sequentially forming a first layer interconnection metal layer; a layer insulating film; and a second layer interconnection metal layer, which comprises a step of forming a stable insulating film between the layer insulating film and the interconnection layer.

DETAILED DESCRIPTION OF THE PREFERRED EMBODIMENTS

Certain embodiments of the preparation of the multilayer interconnection of the present invention will be illustrated in comparison with the preparation of the conventional multilayer interconnection.

Figure 1A:
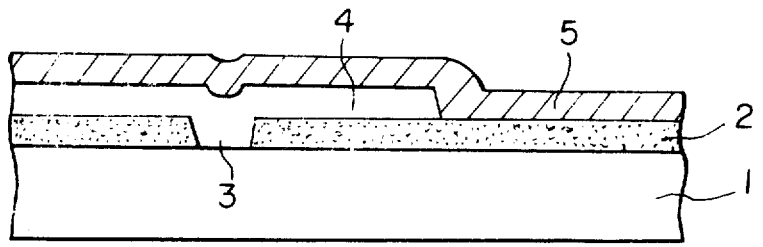
FIGS. 1 (a), (b) are respectively sectional views showing sequential steps of the preparation of the conventional multilayer interconnection.
Figure 1B:
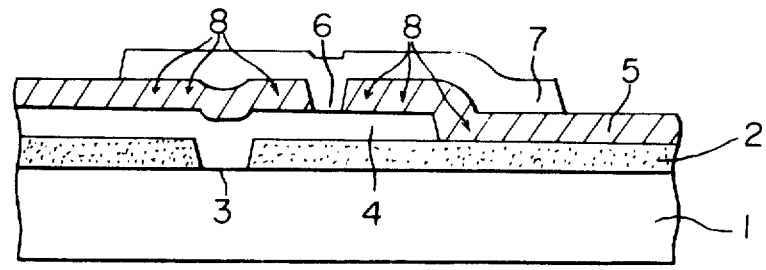

FIGS. 1 (a), (b) show steps of the preparation of the conventional multilayer interconnection. In FIGS. 1 (a), (b), an oxide film (2) is formed on a semiconductor substrate (1) by a thermal oxidation process etc., and a contact hole (3) for electric connection of the semiconductor substrate (1) is formed at a desired position in the oxide film (2). A metal film such as an aluminum film is formed on all the surface of the oxide film by a vapor deposition process or a sputtering process and the aluminum film is processed into a desired pattern by etching to obtain an aluminum interconnection layer (4) as the first layer. A nitride film (5) is formed on all the layer by a plasma enhanced chemical vapor deposition process. Through-holes (6) are formed at desired positions and then an aluminum film is formed by the vapor deposition process or the sputtering process and the aluminum film is processed into a desired pattern by etching to obtain an aluminum interconnection layer (7) as the second layer.

The product is sintered at a temperature of lower than a softening point of aluminum. The mutual diffusion is resulted between the second aluminum layer (7) and the nitride film (5) whereby the aluminum component is immersed into the nitride film (5) as shown by the reference (8). After sintering for several hours, the aluminum component reaches to the first aluminum interconnection (4) whereby the short-circuit is resulted between the interconnection layers (4), (7). The reliability of the product is remarkably inferior.

Figure 2A:
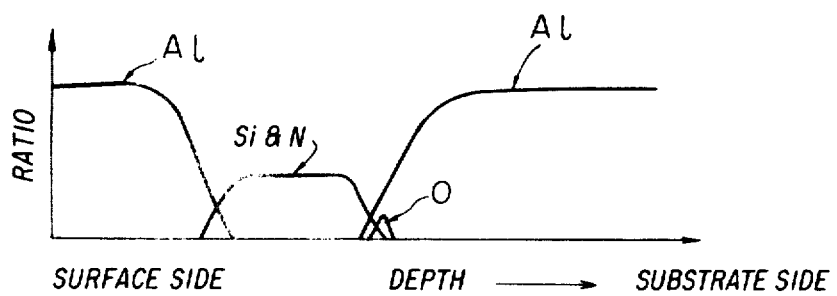
FIGS. 2 (a), (b) show characteristic profiles for each layer mutual diffusion before or after the sintering treatment in the conventional process.
Figure 2B:
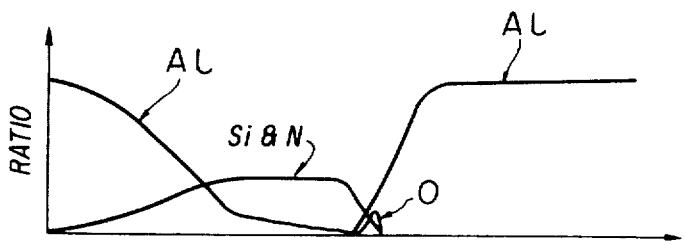

FIGS. 2 (a), (b) show profiles of the mutual diffusion between the aluminum interconnection layer and the nitride film before and after sintering at 500° C. which are measured by an auger electron spectrophotometer. The graphs show the fact that the mutual diffusion between the aluminum interconnection layer (7) and the nitride film (5) was remarkably small before the sintering, but it is remarkably large to immerse the aluminum component of the interconnection (7) into the nitride film (5) to reach near the aluminum interconnection layer (4) after sintering for several hours. In the phenomenon, the mutual diffusion between the first aluminum interconnection layer (4) and the nitride film (5) is not substantially found and a small peak for oxygen is found near the interface between them. This phenomenon may be resulted by growth of natural oxide film on the surface of the first aluminum interconnection layer to impart as a barrier for preventing the mutual diffusion. In view of the phenomenon, the mutual diffusion can be prevented by forming a thin oxide film between the aluminum interconnection layer and the nitride film.

Figure 3A:
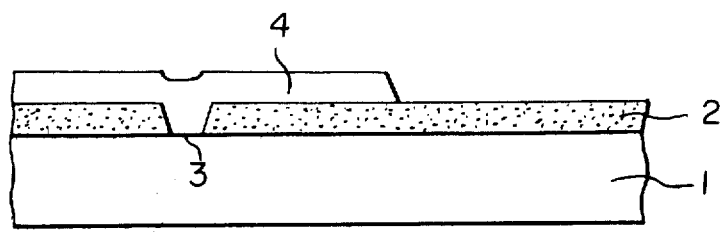
FIGS. 3 (a), (b), (c) are respectively sectional views showing sequential steps of the preparation of the conventional multi-layer interconnection as one embodiment of the present invention.
Figure 3B:
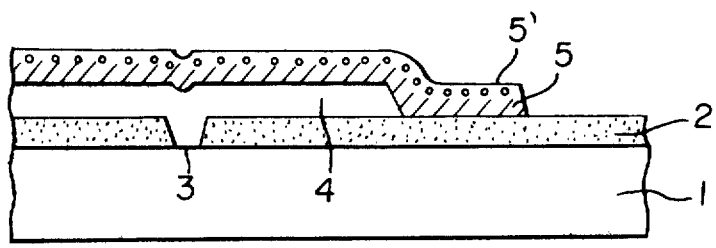
Figure 3C:
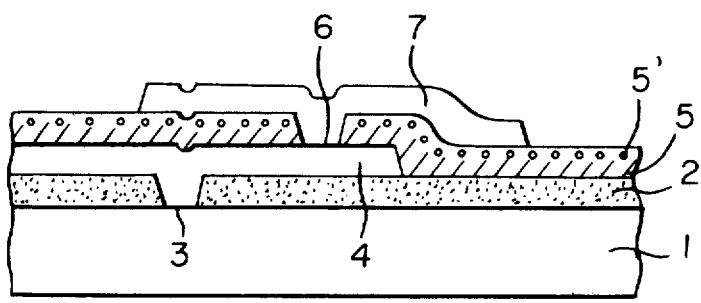
Figure 4A:
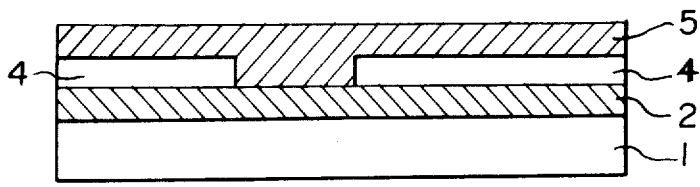
FIGS. 4 (a) to (f) are respectively sectional views showing sequential steps of the other embodiment for the preparation of the multilayer metal interconnection of the present invention.
Figure 4B:
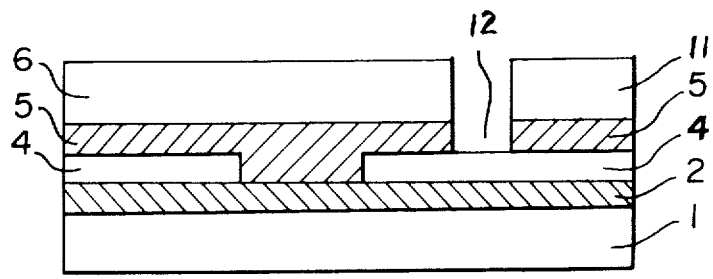
Figure 4C:
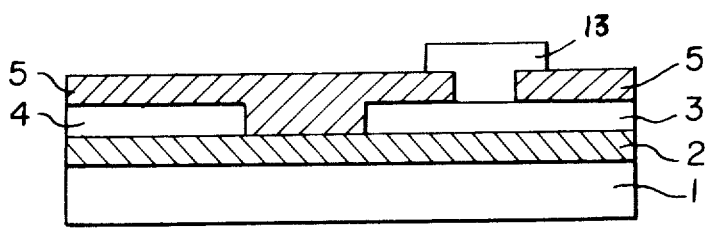
Figure 4D:
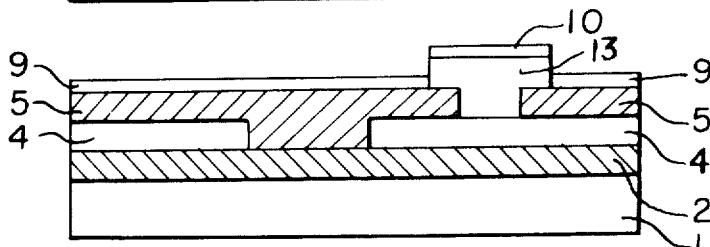
Figure 4E:
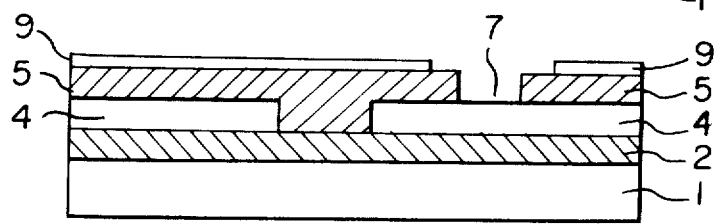
Figure 4F:
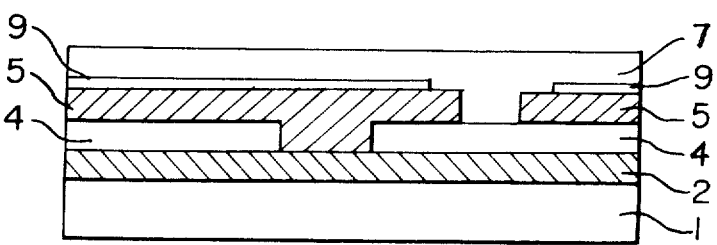

Referring to FIGS. 3 (a) to (c), one embodiment of the preparation of the multilayer interconnection of the present invention will be illustrated.

In the embodiment, the oxide film (2) is formed on the semiconductor substrate (1) and the contact hole (3) is formed and then the first aluminum interconnection layer (4) is formed as those of the conventional embodiment. When the nitride film (5) is formed by the plasma enhanced chemical vapor deposition process, the plasma is generated in a mixed gas of $SiH_4$, $NH_3$ and $N_2$ to result the growth of the nitride film as the conventional process and then an oxidizing gas such as $O_2$, $N_2O$ or $CO_2$ is incorporated to result the growth of oxynitride layer ($Si_xO_yN_z$) (5') on the surface layer. After the treatment, the through-holes (6) is formed and the second aluminum interconnection layer (7) is formed as those of the conventional embodiment.

In the multilayer interconnection formed by this embodiment, even though it is sintered at 500° C. for several hours, any short-circuit between the interconnection layers (4), (7) is not found. The reliability of the device is remarkably high.

In this embodiment, aluminum is used for the interconnection layers, however, it is also possible to use aluminum alloys such as AlSi and AlSiCu and the other low melting metals which cause the mutual diffusion with the nitride film.

In this embodiment, the oxynitride layer is formed on the surface layer of the nitride film, however, it is possible to obtain the same effect by forming Si rich layer on the surface layer by increasing a ratio of $NH_3$ to all the mixed gas.

In accordance with this embodiment, the thin oxide film is formed on the surface layer of the nitride film in the growth of the plasma enhanced chemical vapor deposited nitride film as the layer insulating film of the multilayer interconnection whereby the mutual diffusion between the interconnection layer made of the low melting metal and the nitride film can be substantially prevented. The multilayer interconnection having high reliability can be easily attained without increasing steps in the preparation thereof.

Referring to FIGS. 4 (a) to (f), the other embodiment of the present invention will be illustrated.

In the embodiment, as shown in FIGS. 4 (a), (b), the silicon oxide film (2) is formed on the silicon semiconductor substrate (1) and then, the first aluminum interconnection layer (4), (4) and the silicon nitride film (5) are sequentially formed on the silicon oxide film (2). The contact hole (12) is selectively formed by using a photoresist (11) on the silicon nitride film (5) and then, the photoresist (11) is removed. The steps are the same as those of the conventional preparation.

In this embodiment, a photoresist (1) is formed in patterning on the silicon nitride film (5) having the contact hole (12) as shown in FIG. 4 (c) and then, thin aluminum oxide films (9), (10) are formed on the silicon nitride film (5) and the patterned photoresist (13) by sputtering an aluminum target with oxygen gas as shown in FIG. 4 (d). The photoresist (13) and the aluminum oxide film (10) formed on the photoresist are removed by a lift-off process to remain the aluminum oxide film (9) as the insulating film on the silicon nitride film (5) except the contact hole (12) and near the opening thereof as shown in FIG. 4 (e). The second aluminum interconnection layer (7) is formed as shown in FIG. 4 (f).

In accordance with the steps, the aluminum oxide layer (9) is formed between the silicon nitride film (5) as the layer insulating film and the second aluminum interconnection layer (7), whereby the diffusion of the second aluminum interconnection layer (7) into the silicon nitride film (5) can be prevented. As a result, the short-circuit between the first and second aluminum interconnection layers (3), (7) can be prevented.

In this embodiment, the lift-off process is employed for removing the aluminum oxide film at the contact hole. It is possible to selectively remove the aluminum oxide film with a mixture of chromium trioxide and phosphoric acid after forming a resist pattern by a conventional photo-engraving process. The aluminum oxide film can be also formed by sputtering an aluminum oxide target with an inert gas such as argon or oxidizing an aluminum film by an anode oxidation after forming the aluminum film. The other metal oxide film such as a silicon oxide film, a titanium oxide film and a hafnium oxide film can be used instead of the aluminum oxide film.

In accordance with the process of the present invention, the stable insulating film is formed between the interconnection metal layer and the layer insulating film whereby the multilayer metal interconnection having no fault of the layer insulation can be obtained.

We claim:

1. A process for preparing a multilayer interconnection which comprises sequentially forming a first interconnection metal layer, a layer insulating film and a second interconnection metal layer, wherein said interconnection metal layer is made of a low melting metal and said layer insulating film is made of a plasma enhanced chemical vapor deposited nitride film and an oxynitride film is formed on the surface layer of said nitride film so as to prevent mutual diffusion between the second interconnection metal layer and said nitride film.

2. The process for preparing a multilayer interconnection according to claim 1 wherein said low melting metal is aluminum or an aluminum alloy.

* * * * *